(12) United States Patent
Kang

(10) Patent No.: US 7,867,872 B2
(45) Date of Patent: Jan. 11, 2011

(54) METHOD FOR MANUFACTURING SEMICONDUCTOR DEVICE WITH UNIFORM CONCENTRATION ION DOPING IN RECESS GATE CHANNEL REGION

(75) Inventor: Myung Hee Kang, Gyeonggi-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 274 days.

(21) Appl. No.: 11/968,758

(22) Filed: Jan. 3, 2008

(65) Prior Publication Data

US 2009/0130811 A1   May 21, 2009

(30) Foreign Application Priority Data

Nov. 16, 2007   (KR) .................. 10-2007-0117206

(51) Int. Cl.
*H01L 21/336* (2006.01)
(52) U.S. Cl. .................. 438/450; 438/259; 438/270
(58) Field of Classification Search .................. None
See application file for complete search history.

(56) References Cited

U.S. PATENT DOCUMENTS 5,998,821 A * 12/1999 Hieda et al. .................. 257/301

2008/0079068 A1 * 4/2008 Kim .......................... 257/330

FOREIGN PATENT DOCUMENTS

| KR | 1020060029871 A | 3/2006 |
| KR | 1020060104086 A | 10/2006 |
| KR | 1020070071697 A | 7/2007 |
| KR | 1020070071698 A | 7/2007 |

* cited by examiner

*Primary Examiner*—Zandra Smith
*Assistant Examiner*—Pamela E Perkins
(74) *Attorney, Agent, or Firm*—Ladas & Parry LLP

(57) ABSTRACT

A semiconductor device is manufactured by defining a groove in a semiconductor substrate, where the groove includes an upper portion and a lower portion, among other steps. A sacrificial layer is then formed to selectively fill the lower portion of the groove. Impurity ions are implanted into the semiconductor substrate while the lower portion of the groove is filled with the sacrificial layer. The sacrificial layer is then removed, and a gate is formed on the groove. In the method for manufacturing the semiconductor device, impurities can be doped at a uniform concentration in the channel area of the semiconductor device.

9 Claims, 4 Drawing Sheets

METHOD FOR MANUFACTURING SEMICONDUCTOR DEVICE WITH UNIFORM CONCENTRATION ION DOPING IN RECESS GATE CHANNEL REGION

CROSS-REFERENCE TO RELATED APPLICATIONS

The present application claims priority to Korean patent application number 10-2007-0117206 filed on Nov. 16, 2007, which is incorporated herein by reference in its entirety.

BACKGROUND OF THE INVENTION

The present invention relates to a method for manufacturing a semiconductor device, and more particularly, to a method for manufacturing a semiconductor device which allows for the doping of ions at a uniform concentration in the channel area of a recess gate.

As semiconductor devices proceed towards a high level of integration, a short channel effect, in which the threshold voltage of a transistor is quickly reduced due to a decrease in the channel length of the transistor, has been observed. In order to remedy this problem, various methods for manufacturing semiconductor devices having various recess channels that are capable of securing an effective channel length have been attempted. As these semiconductor devices have proceeded towards higher levels of integration, research has been directed towards a method for defining a bulb type groove in a recess gate forming area so as to further increase an effective channel length. The bulb type recess gate has advantages including an improved DIBL (drain induced barrier lowering) characteristic.

Hereinbelow, a conventional method for manufacturing a semiconductor device having a bulb type recess gate will be schematically described.

A trench is defined in a semiconductor substrate by etching the element isolation region of the semiconductor substrate. An insulation layer is then deposited in the trench to fill the trench, thereby forming an element isolation structure for delimiting the active region of the semiconductor substrate. Wells are formed by implementing an ion implantation process for the semiconductor substrate (which is formed with the element isolation structure). A recess gate forming area is anisotropically etched in the active region of the semiconductor substrate (which is delimited by the element isolation structure) to define a vertical groove. An oxide layer is then formed on the overall surface of the semiconductor substrate including the vertical groove.

A passivation layer is formed for exposing the bottom surface of the vertical groove by removing a portion of the oxide layer which is formed on the bottom surface of the vertical groove. Then a portion of the semiconductor substrate on the bottom surface of the vertical groove which is exposed through the passivation layer is isoptripically etched to define a spherical groove. As a result, a bulb type groove including the vertical groove and the spherical groove is defined in the semiconductor substrate.

After removing the passivation layer, a channel ion implantation process is implemented into the semiconductor substrate defined with the bulb type groove. Then, a gate insulation layer, a gate conductive layer, and a hard mask layer are sequentially formed on the semiconductor substrate including the surface of the bulb type groove. These layers are then etched to form a recess gate in the bulb type groove. A source area and a drain area are formed in the semiconductor substrate on both sides of the recess gate.

However, in the conventional semiconductor device having the bulb type recess gate, when the channel ion implantation process is implemented, it is impossible to uniformly dope impurities into the semiconductor substrate in the channel area of the recess gate. More specifically, the impurities cannot be uniformly doped into the semiconductor substrate on the surface of the spherical groove. The concentrations of the impurities that are doped into the semiconductor substrate on the sidewall and the bottom of the spherical groove are different. As a consequence, the threshold voltage of the gate varies depending upon a position on the recess gate, causing a deterioration in the threshold voltage characteristic of the device.

SUMMARY OF THE INVENTION

An embodiment of the present invention is directed to a method for manufacturing a semiconductor substrate wherein impurities are doped at a uniform concentration in the channel area of a recess gate.

Also, an embodiment of the present invention is directed to a method for manufacturing a semiconductor substrate that improves the threshold voltage characteristics of a recess gate.

In one aspect, a method for manufacturing a semiconductor device comprises the steps of defining a groove in a semiconductor substrate, the groove including an upper portion and a lower portion; forming a sacrificial layer to selectively fill the lower portion of the groove; implanting impurity ions into the semiconductor substrate while the lower portion of the groove is filled with the sacrificial layer; removing the sacrificial layer; and forming a gate on the semiconductor substrate to fill the groove from which the sacrificial layer is removed.

Preferably, the groove comprises a bulb type groove that includes a vertical groove and a spherical groove communicating with a lower end of the vertical groove.

The vertical groove corresponds to the upper portion of the groove, and the spherical groove corresponds to the lower portion of the groove.

The sacrificial layer has an amorphous phase.

The sacrificial layer may comprise an oxide layer having an amorphous phase.

The sacrificial layer may also comprise a photoresist layer having an amorphous phase.

The step of forming a sacrificial layer comprises the steps of depositing a sacrificial layer on the semiconductor substrate to fill the groove; and etching the sacrificial layer such that the sacrificial layer remains only on the lower portion of the groove.

The step of etching the sacrificial layer is implemented using an etch-back process.

The gate has a stacked structure of a gate insulation layer, a polysilicon layer, a metal-based layer, and a hard mask layer.

After the step of forming a gate, the method further comprises the step of forming a source area and a drain area in a surface of the semiconductor substrate on both sides of the gate.

DESCRIPTION OF SPECIFIC EMBODIMENT

In the present invention, a groove for a gate is defined by etching a semiconductor substrate. A sacrificial layer is filled only in the lower portion of the groove, and then a channel ion implantation process is implemented. The sacrificial layer is made of an oxide layer or a photoresist layer having an amorphous phase.

The impurities ion-implanted in the channel ion implantation process are dispersed in every direction in the lower portion of the groove (which is defined in the semiconductor substrate and is filled with the sacrificial layer having an amorphous phase); and thus, the impurities can be doped at a uniform concentration in the semiconductor substrate on the surface of the lower portion of the groove filled with the sacrificial layer.

Hereinbelow, a specific embodiment of the present invention will be described in detail with reference to the attached drawings.

FIGS. 1A through 1G are cross-sectional views illustrating the processes of a method for manufacturing a semiconductor device in accordance with an embodiment of the present invention.

Figure 1A:
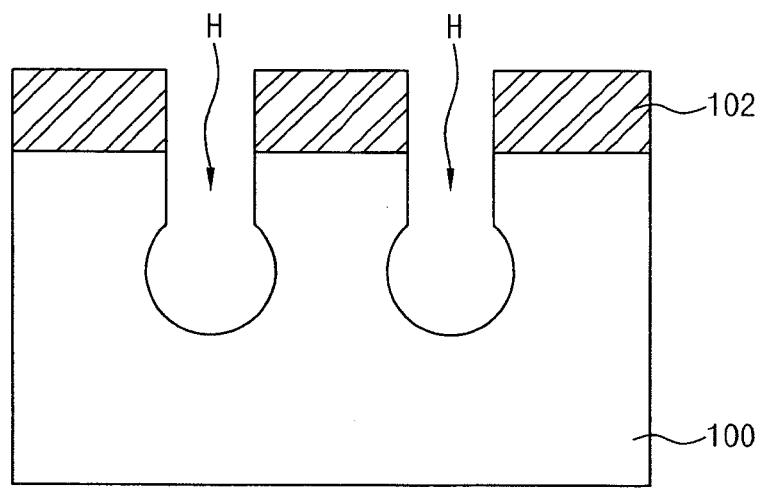
FIGS. 1A through 1G are cross-sectional views illustrating the processes of a method for manufacturing a semiconductor device in accordance with an embodiment of the present invention.

Referring to FIG. 1A, a trench is defined in a semiconductor substrate 100 by etching the element isolation region of the semiconductor substrate 100. An insulation layer is then deposited in the trench to fill the trench to form an element isolation structure (not shown) for delimiting the active region on the semiconductor substrate 100. It is preferred that wells be formed in the semiconductor substrate 100 formed with the element isolation structure using an ion implantation process.

A recess mask 102 is formed on the semiconductor substrate 100 formed with the element isolation structure, and the recess mask leaves the gate forming area of the active region (which is delimited by the element isolation structure) exposed. A vertical groove is defined by anisotropically etching a portion of the semiconductor substrate 100 that is exposed through the recess mask 102. A passivation layer (not shown) made of, for example, an oxide layer, is then formed on the sidewall of the vertical groove.

A spherical groove is defined by isotropically etching a portion of the semiconductor substrate 100 which forms the bottom of the vertical groove and is exposed due to the absence of the passivation layer. As a result, a bulb type groove H including the vertical groove and the spherical groove communicating with the lower end of the vertical groove is defined in the active region of the semiconductor substrate 100. The upper portion of the bulb type groove H corresponds to the vertical groove, and the lower portion of the bulb type groove H corresponds to the spherical groove.

Figure 1B:
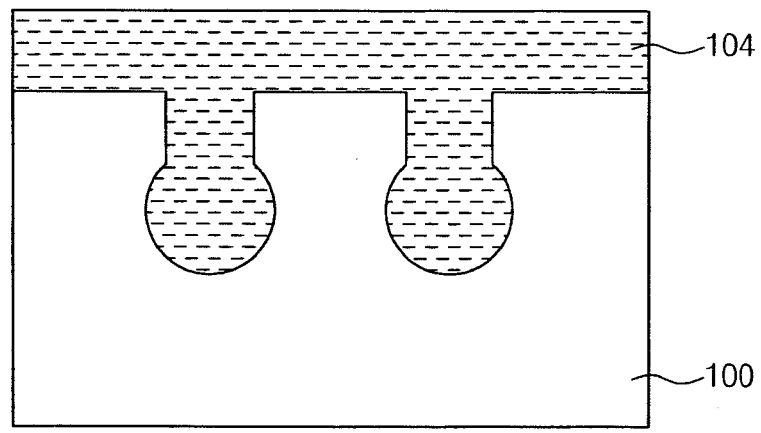
Figure 1C:
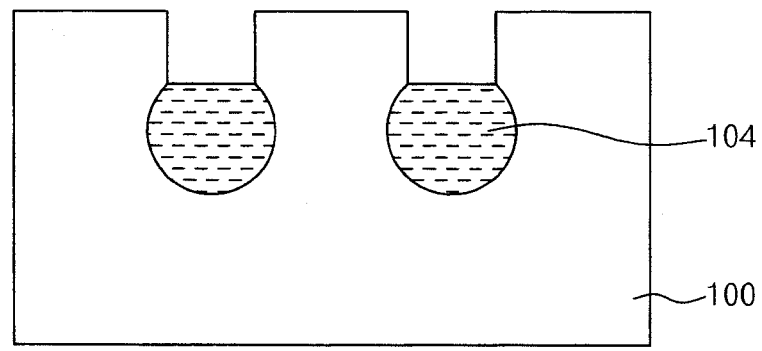

Referring to FIG. 1B, after removing the recess mask 102 and the passivation layer, a sacrificial layer 104 is deposited on the resultant semiconductor substrate 100 to fill the bulb type groove H. Preferably, the sacrificial layer 104 is made of a layer having an amorphous phase, for example, an amorphous photoresist layer or an amorphous oxide layer.

Referring to FIG. 5C, the sacrificial layer 104 is etched such that only the portion of the sacrificial layer 140 in the lower portion of the bulb type groove H, (i.e. the spherical groove) remains. As an example, the etching may be conducted using an etch-back process. Hence, the remaining sacrificial layer 104 has a thickness that fills the lower portion of the bulb type groove H, and preferably, the spherical groove.

Figure 1D:
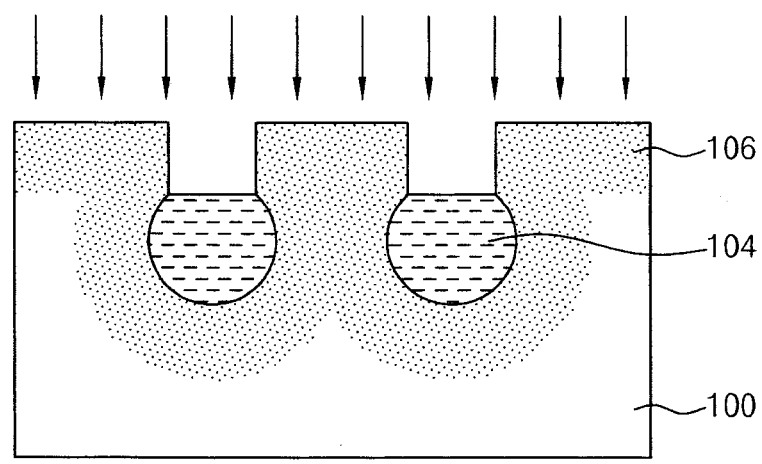

Referring to FIG. 1D, a channel ion implantation process is implemented for the semiconductor substrate 100 having the sacrificial layer 104 remaining in the lower portion of the bulb type groove H. Here, since the channel ion implantation process is implemented while the sacrificial layer 104 having the amorphous phase is formed in the lower portion of the bulb type groove H, ion-implanted impurities are dispersed in every direction at the portions of the semiconductor substrate on which the sacrificial layer 104 is formed. As a result, the impurities can be doped at a uniform concentration on the surface of the lower portion of the bulb type groove H, that is, on a portion of the semiconductor substrate 100 that defines the channel area of a recess gate to be subsequently formed. By conducting the ion doping in the manner, the threshold voltage characteristics of the recess gate, which is subsequently formed, can be improved. In FIG. 1D, the reference numeral 106 designates a channel ion implantation layer in which the impurities are doped at a uniform concentration using the channel ion implantation process.

Figure 1E:
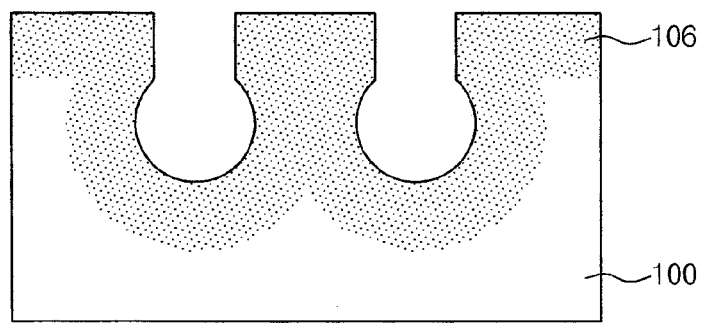

Referring to FIG. 1E, the sacrificial layer 104 is removed from the resultant semiconductor substrate 100 on which the channel ion implantation process was implemented. It is preferred that the removal of the sacrificial layer be conducted through etching.

Figure 1F:
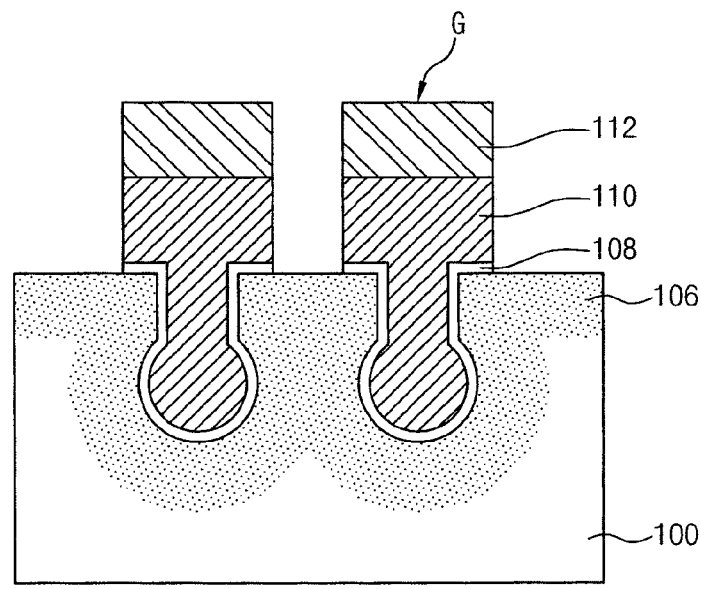

Referring to FIG. 1F, a gate insulation layer 108 is formed on the semiconductor substrate 100 and the surface of the bulb type groove H, and then a gate conductive layer 110 is formed on the gate insulation layer 108 to fill the bulb type groove H. The gate conductive layer 110 is formed as a stacked layer including a polysilicon layer and a metal-based layer. Thereupon, it is preferred that the surface of the gate conductive layer 110 be planarized using, for example, CMP (chemical mechanical polishing) or etch-back.

A gate hard mask layer 112 is formed on the planarized gate conductive layer 110. Then, by etching the gate hard mask layer 112, the gate conductive layer 110, and the gate insulation layer 108; a recess gate G is formed on the bulb type groove H.

Figure 1G:
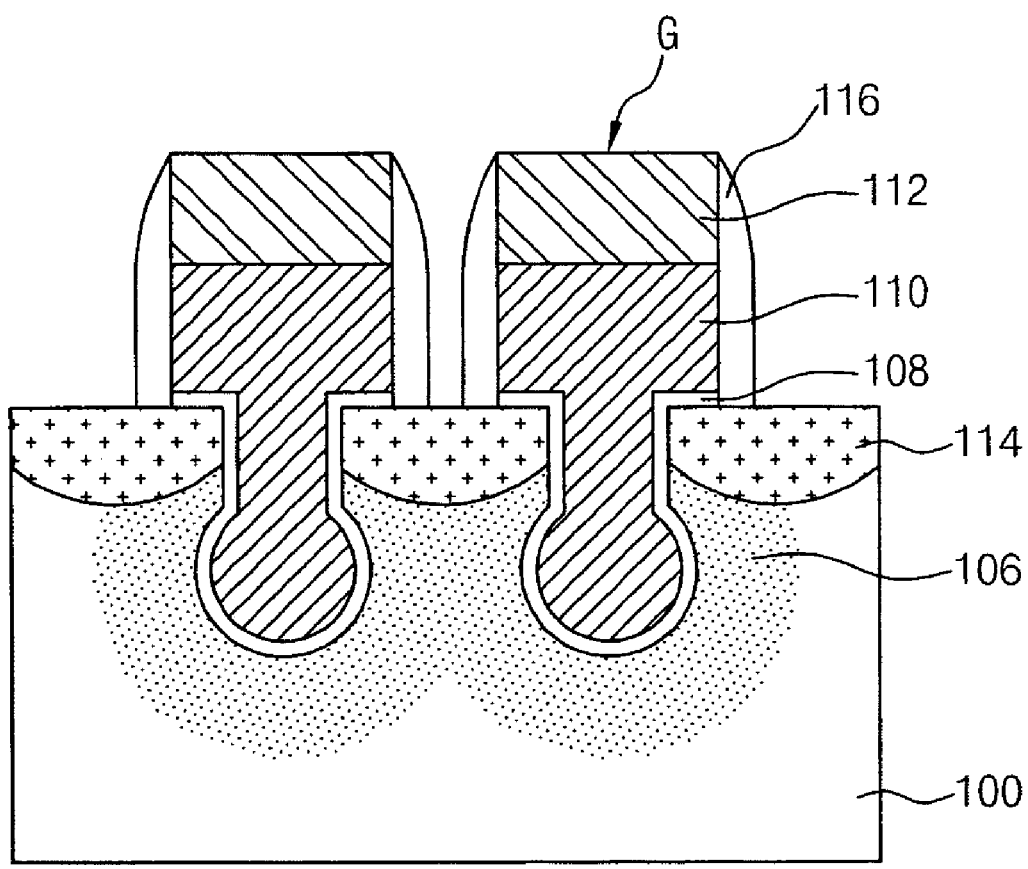

Referring to FIG. 1G, a source area and a drain area 114 are formed in the semiconductor substrate 100 on both sides of the recess gate G using, for example, an ion implantation process. Then, preferably, spacers 116 are formed on both sidewalls of the recess gate G.

Thereafter, while not shown in the drawings, by sequentially implementing a series of subsequent well-known processes, the manufacturing process of a semiconductor device having the recess gate in accordance with the embodiment of the present invention is completed.

As is apparent from the above description, the present invention provides advantages by implementing a channel ion implantation process while an amorphous sacrificial layer is formed within the spherical portion of a bulb type groove, including the advantage that impurities can be doped at a uniform concentration in the channel area of the recess gate of a semiconductor substrate.

As a result, in the present invention, it is possible to prevent the threshold voltage from differing depending upon a position on the recess gate of the semiconductor substrate. As such, in an embodiment of the present invention, the threshold voltage characteristics of the recess gate can be improved, and DIBL and swing characteristics of a semiconductor device can be improved. In addition, in the present invention, because a doping concentration can be uniformly adjusted in the channel area under a source area and a drain area, the electric field can be mitigated, and the refresh characteristic of the semiconductor device can be improved.

Although a specific embodiment of the present invention has been described for illustrative purposes, those skilled in the art will appreciate that various modifications, additions and substitutions are possible, without departing from the scope and the spirit of the invention as disclosed in the accompanying claims.

What is claimed is:

1. A method for manufacturing a semiconductor device, comprising the steps of:
   defining a groove in a semiconductor substrate, the groove including an upper portion and a lower portion;
   forming a sacrificial layer to selectively fill the lower portion of the groove, wherein the sacrificial layer has an amorphous phase;
   implanting impurity ions into the semiconductor substrate while the lower portion of the groove is filled with the sacrificial layer such that a channel ion implantation layer is formed on the surface of the lower portion of the groove;
   removing the sacrificial layer; and
   forming a gate on the semiconductor substrate to fill the groove from which the sacrificial layer is removed;
   wherein the implanting is implemented such that the implanted impurity ions are dispersed in every direction at portions of the semiconductor substrate while the lower portion of the groove is filled with the sacrificial layer, and the impurity ions can be doped at a uniform concentration on the surface of the lower portion of the groove.

2. The method according to claim 1, wherein the groove comprises a vertical groove and a spherical groove communicating with a lower end of the vertical groove.

3. The method according to claim 2, wherein the vertical groove corresponds to the upper portion of the groove, and the spherical groove corresponds to the lower portion of the groove.

4. The method according to claim 1, wherein the sacrificial layer comprises an oxide layer having an amorphous phase.

5. The method according to claim 1, wherein the sacrificial layer comprises a photoresist layer having an amorphous phase.

6. The method according to claim 1, wherein the step of forming a sacrificial layer comprises the steps of:
   depositing a sacrificial layer on the semiconductor substrate to fill the groove; and
   etching the sacrificial layer such that the sacrificial layer remains only in the lower portion of the groove.

7. The method according to claim 6, wherein the step of etching the sacrificial layer is implemented using an etch-back process.

8. The method according to claim 1, wherein the gate has a stacked structure of a gate insulation layer, a polysilicon layer, a metal-based layer, and a hard mask layer.

9. The method according to claim 1, wherein, after the step of forming a gate, the method further comprises the step of:
   forming a source area and a drain area in a surface of the semiconductor substrate on both sides of the gate.

* * * * *